United States Patent
Yamazaki et al.

(10) Patent No.: US 8,780,193 B2
(45) Date of Patent: Jul. 15, 2014

(54) PHYSICAL PROPERTIES MEASURING METHOD AND APPARATUS

(75) Inventors: Takashi Yamazaki, Kawasaki (JP); Takeshi Soeda, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 233 days.

(21) Appl. No.: 13/071,797

(22) Filed: Mar. 25, 2011

(65) Prior Publication Data

US 2011/0304724 A1 Dec. 15, 2011

(30) Foreign Application Priority Data

Jun. 15, 2010 (JP) ................................. 2010-135834
Feb. 15, 2011 (JP) ................................. 2011-029413

(51) Int. Cl.
*H04N 7/18* (2006.01)
*H01J 37/28* (2006.01)

(52) U.S. Cl.
CPC . *H04N 7/18* (2013.01); *H01J 37/28* (2013.01)
USPC .......................................... 348/80; 250/307

(58) Field of Classification Search
CPC .... H01J 37/28; H01J 37/224; G01N 21/6458; G01N 23/20; G02B 21/24; H04N 7/18; G21N 7/00
USPC ......... 348/80, E07.085; 850/9; 250/311, 307, 250/397, 322; 382/190, 151, 181, 194, 201, 382/206, 289, 297, 305
See application file for complete search history.

(56) References Cited

U.S. PATENT DOCUMENTS

| | | | |
|---|---|---|---|
| 6,941,015 B1* | 9/2005 | Kim et al. ...................... | 382/190 |
| 2003/0006373 A1* | 1/2003 | Koguchi et al. ............... | 250/311 |
| 2003/0066964 A1* | 4/2003 | Nagayama et al. ........... | 250/311 |
| 2005/0063285 A1* | 3/2005 | Mushika et al. ......... | 369/112.29 |
| 2006/0251994 A1* | 11/2006 | Huang et al. .................. | 430/311 |

OTHER PUBLICATIONS

Phase Contrast Electron Microscopy: Development of Thin-Film Phase Plates and Biological Applications. Kuniaki Nagayama and Radostin Danev, Okazaki Institute of Natural Sciences, Okazaki 444-8787, Japan 2008.*
Quantitative Phase Imaging. Mustafa Mir, Basanta Bhaduri, Ru Wang, Ruoyu Zhu and Gabriel Popescu, Beckman Institute fro Advanced Science and Technology, University of Illinois at Urbana-Champain, Urbana, IL, USA.*
R.F. Egerton; "Applications of Energy-Loss Spectroscopy;" Electron energy-loss spectroscopy in the electron microscope; 1996' pp. 301-312 (7 Sheets.)/p. 1 of specification.
J.C.H. Spence, et al.; "Two Beam Methods for Thickness Determination;" Electron Microdiffraction; 1992; pp. 86-88 (2 Sheets)/p. 2 of specification.

(Continued)

*Primary Examiner* — Dave Czekaj
*Assistant Examiner* — Dramos I Kalapodas
(74) *Attorney, Agent, or Firm* — Kratz, Quintos & Hanson, LLP

(57) ABSTRACT

A physical properties measuring method includes: acquiring an experimental convergent beam electron diffraction image of a sample by using a transmission electron microscope; calculating Zernike moment intensities of the experimental convergent beam electron diffraction image; and comparing the Zernike moment intensities of the experimental convergent beam electron diffraction image with Zernike moment intensities of calculated convergent beam electron diffraction images calculated on changed physical properties of the sample.

8 Claims, 14 Drawing Sheets

(56) References Cited

OTHER PUBLICATIONS

T. Yamazaki, et al.; Quantitative and easy estimation of a crystal bending effect using low-order CBED patterns; Journal of Electron Microscopy; vol. 57; No. 6; 2008; pp. 181-187 (7 Sheets)/p. 2 of specification.

Taiwanese Office Action issued for counterpart Taiwan Patent Application No. 100110043 dated Dec. 6, 2013.

* cited by examiner

FIG. 1A
FIG. 1B
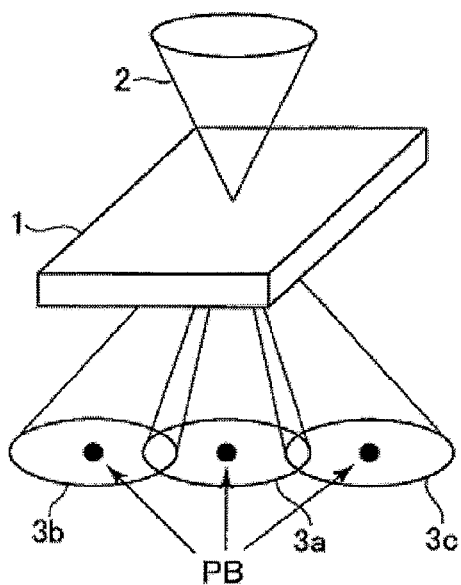
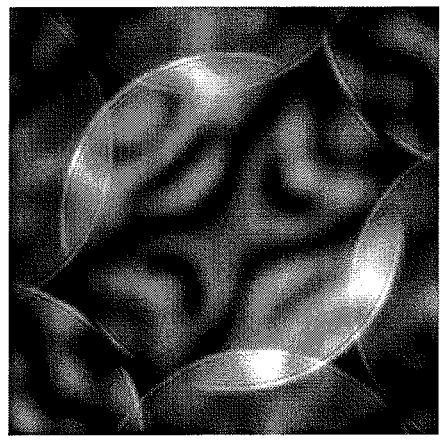

FIG. 2

| Order | Zernike moment |
|---|---|
| 0 | $A_{0,0}$ |
| 1 | $A_{1,1}$ |
| 2 | $A_{2,0}, A_{2,2}$ |
| 3 | $A_{3,1}, A_{3,3}$ |
| 4 | $A_{4,0}, A_{4,2}, A_{4,4}$ |
| 5 | $A_{5,1}, A_{5,3}, A_{5,5}$ |

FIG. 3A   FIG. 3B   FIG. 3C
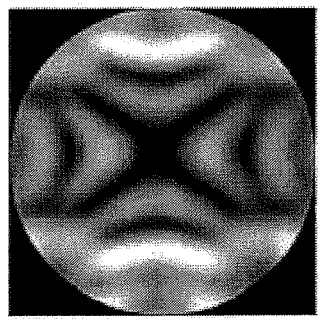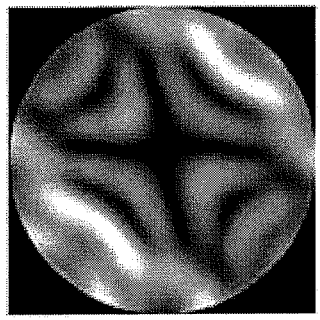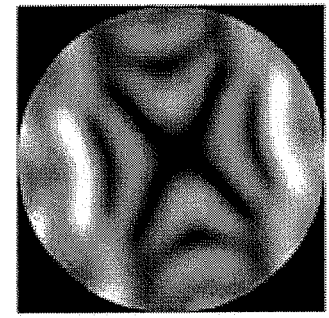
FIG. 3D
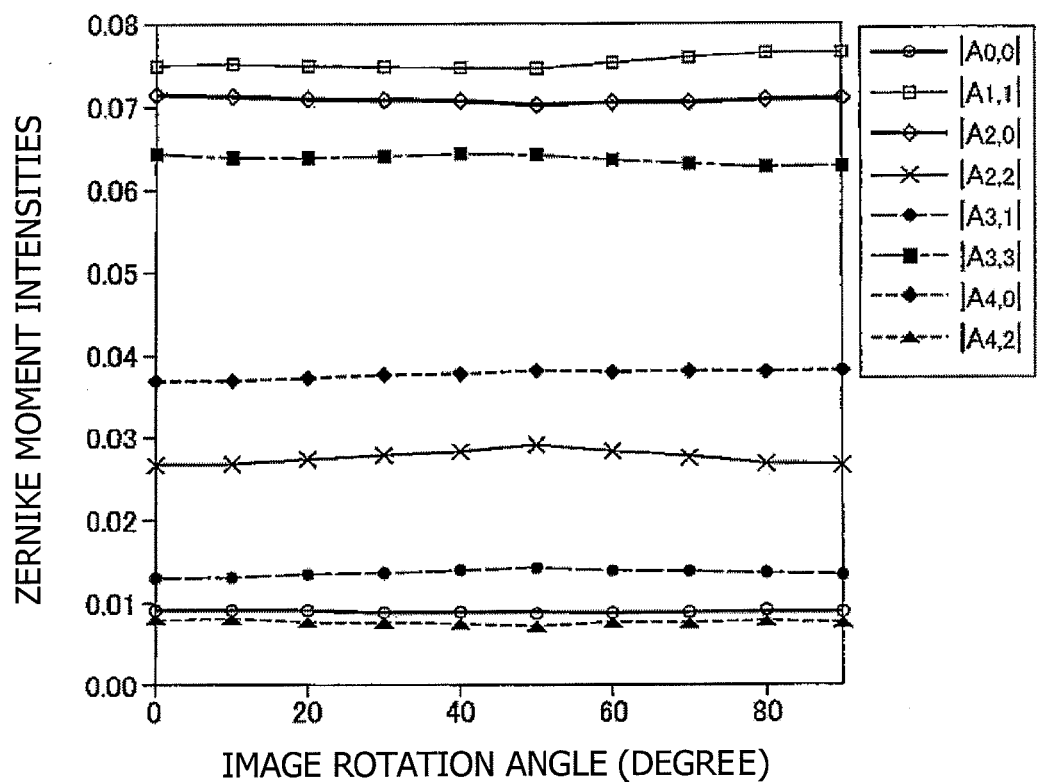

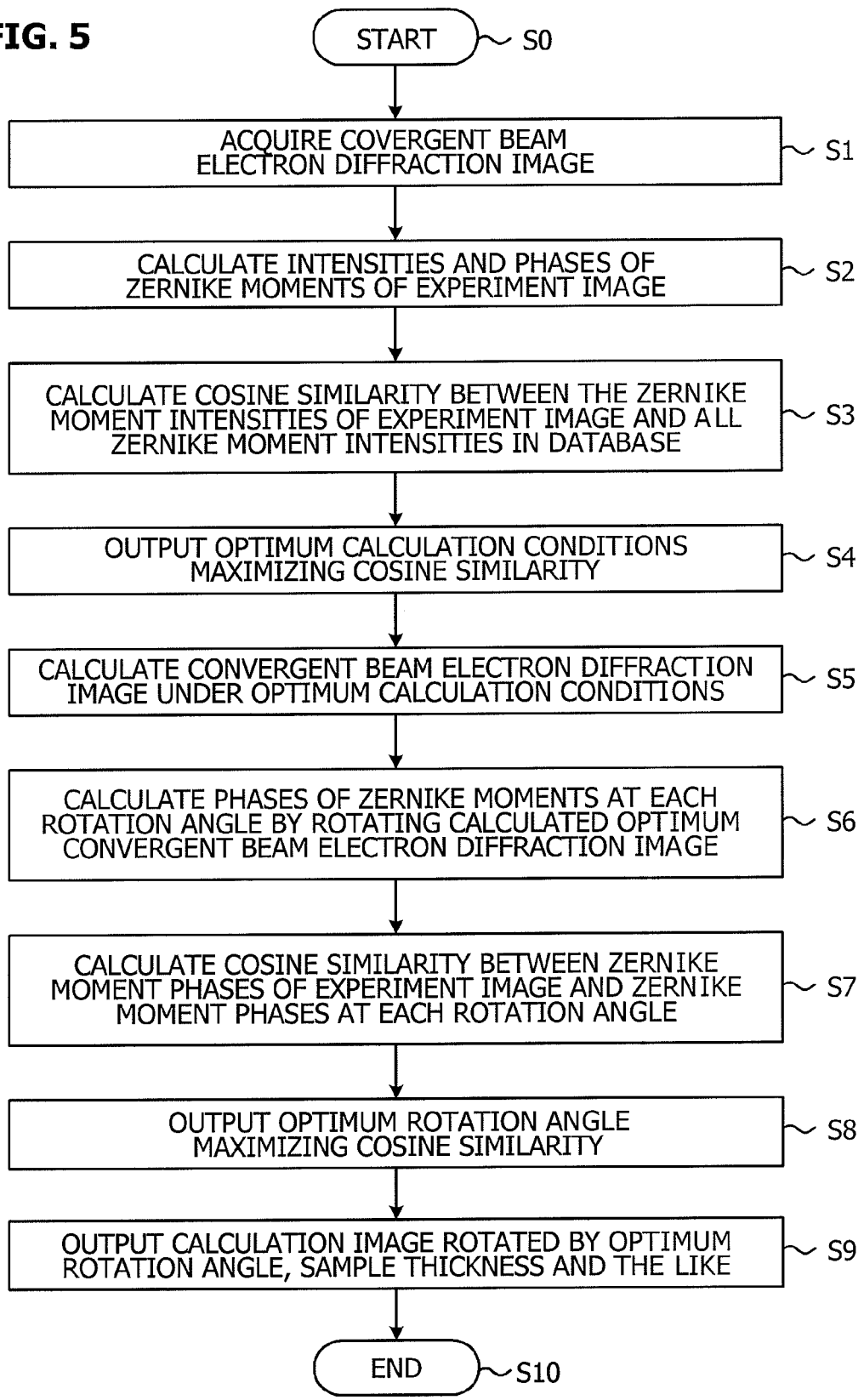

FIG. 7A     FIG. 7B
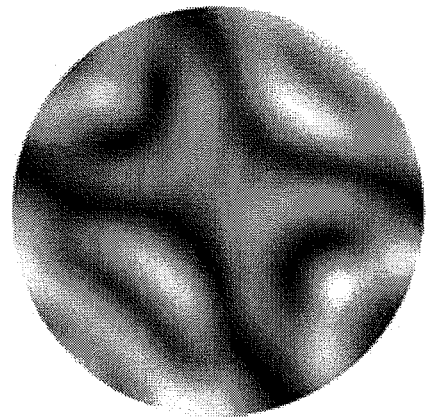 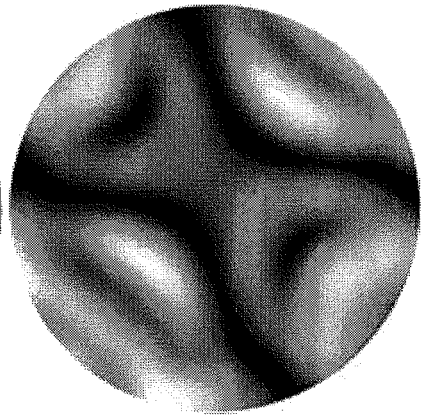

FIG. 8A  FIG. 8B
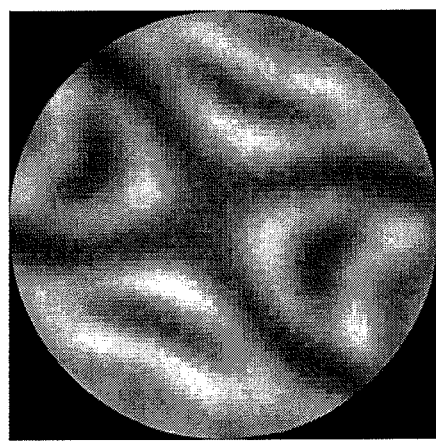 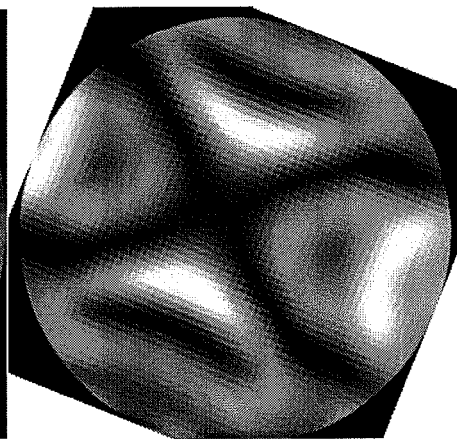

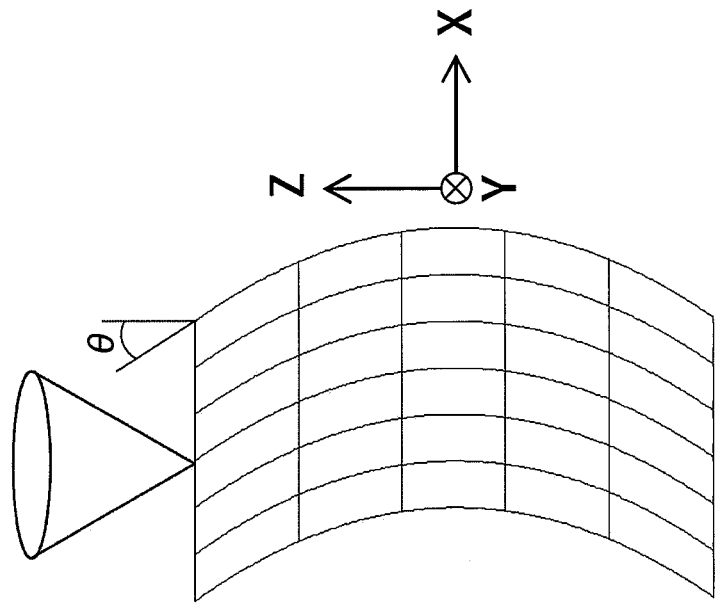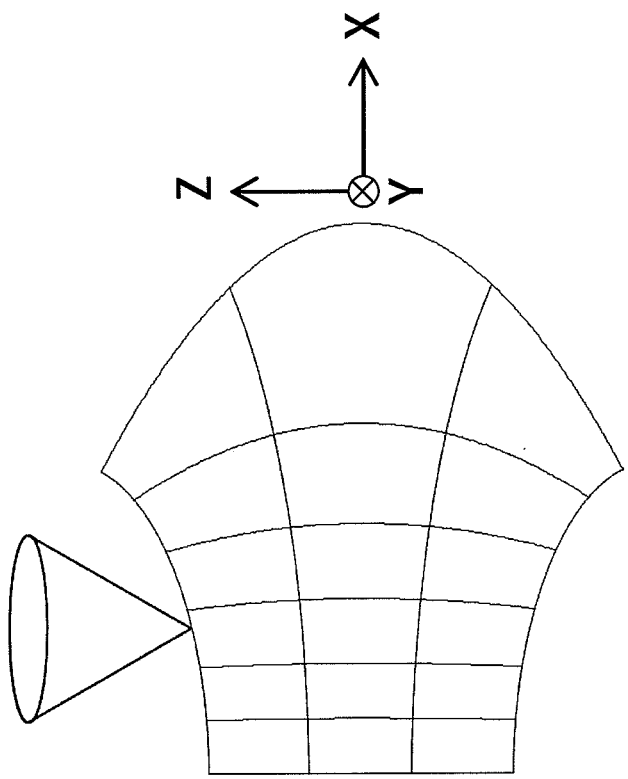
FIG. 10B
FIG. 10A

FIG. 13B CALCULATION IMAGE
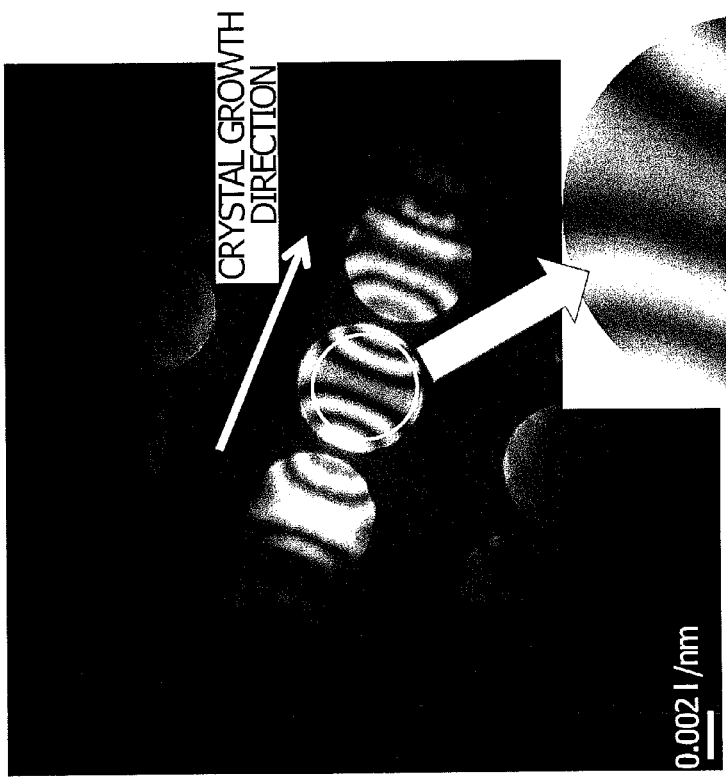
FIG. 13A EXPERIMENT IMAGE

FIG. 14

CALCULATE WHOLE CALCULATION IMAGE ROTATED BY OPTIMUM ROTATION ANGLE, AND OUTPUT WHOLE CALCULATION IMAGE, SAMPLE THICKNESS AND THE LIKE, AND POLARITY — S9'

US 8,780,193 B2

PHYSICAL PROPERTIES MEASURING METHOD AND APPARATUS

CROSS-REFERENCE TO RELATED APPLICATION

This application is based upon and claims the benefit of priority of the prior Japanese Patent Applications No. 2010-135834, filed on Jun. 15, 2010, and No. 2010-029413, filed on Feb. 15, 2011, the entire contents of which are incorporated herein by reference.

FIELD

The present invention relates to physical properties measuring method and apparatus using convergent beam electron diffraction of a transmission electron microscope.

BACKGROUND

A variety of methods of measuring a sample thickness by using a transmission electron microscope have been proposed heretofore. A method widely used in recent years is a method of calculating a thickness from a mean free path of inelastic scattering using a distribution of electron energy loss (refer, for example, to R. F. Egerton, Electron energy-loss spectroscopy in the electron microscope (1996, Plenum Press, New York) pp. 301 to 312). Although this method is very simple, it is known that a value of a mean free path is inaccurate, and in addition the value changes with sample contamination, a natural oxide film or the like and it is possible to measure only a relative thickness.

A most general method of measuring an absolute film thickness is a method of measuring a film thickness by acquiring a convergent beam electron diffraction image in a two-wave excited state and using an appeared interference fringe (refer, for example, to J. C. H. Spence and J. M. Zuo, Electron Microdiffraction (1992, Plenum Press, New York) pp. 86 to 88). Some problems have been pointed out for this method, however; it is necessary to slant a sample greatly in order to make the sample enter a two-wave excited state and to know in advance an extinction distance.

A method of measuring a crystal bending distortion by using a transmission electron microscope has also been proposed.

A method of measuring a sample thickness and a crystal bending distortion at high precision has been proposed in recent years by comparing a convergent beam electron diffraction image obtained through experiments with an image obtained through calculation (refer to T. Yamazaki, A. Kashiwagi, K. Kuramochi, M. Ohtsuka, I. Hashimoto, and K. Watanabe, Journal of Electron Microscopy 57 (2008) pp. 181 to 187). This method has a relatively high precision and measurements are possible if calculation software is available. In using this method, if calculation is performed each time a calculation image coincident with the experiment image is searched, it is very inefficient. It is therefore desired to configure a database of calculation images. It is, however, necessary to prepare a huge database capacity in order to compare a whole two-dimensional image between a calculation image and an experiment image. An image rotation operation is also necessary for image matching.

SUMMARY

According to one aspect of the present invention, a physical properties measuring method includes: acquiring an experimental convergent beam electron diffraction image of a sample by using a transmission electron microscope; calculating Zernike moment intensities of the experimental convergent beam electron diffraction image; and comparing the Zernike moment intensities of the experimental convergent beam electron diffraction image with Zernike moment intensities of calculated convergent beam electron diffraction images calculated on changed physical properties of the sample, The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 1A is a schematic perspective view illustrating an observation state of a sample by convergent beam electron diffraction, and FIG. 1B illustrates an observed convergent beam electron diffraction image.

FIG. 2 is a table summarizing 0-th to 5-th order Zernike moments.

FIGS. 3A to 3C illustrate example of calculation images, and FIG. 3D is a graph plotting Zernike moment intensities of the calculation image of FIG. 3A at each rotation angle.

FIG. 5 is a flow chart illustrating a sequence of the sample thickness measuring process of the first embodiment.

FIG. 7A illustrates an experiment image similar to FIG. 6A, and FIG. 7B is a calculation image of FIG. 6B with a corrected rotation angle.

FIG. 8A illustrates another example of the experiment image, and FIG. 8B illustrates an optimum calculation image for the experiment image of FIG. 8A.

FIG. 10A is a schematic diagram illustrating an Si film bending distortion and an incidence electron beam, and FIG. 10B is a schematic diagram modeling a bending distortion near a measurement position of convergent beam electron diffraction.

FIG. 13A illustrates an experiment image of a GaN sample of a third embodiment, and FIG. 13B illustrates an optimum calculation image including scattered discs for the experiment image of FIG. 13A.

FIG. 14 illustrates a portion of the flow chart of the polarity judgment process of the third embodiment.

DESCRIPTION OF EMBODIMENTS

Figure 4:
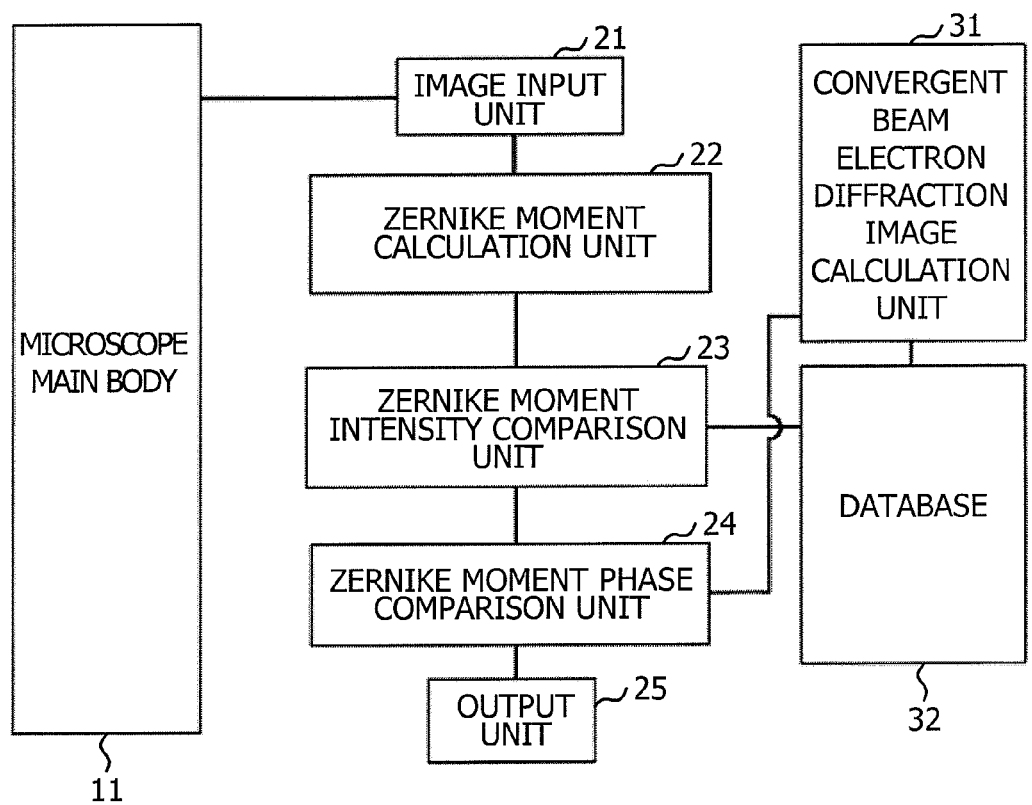
FIG. 4 is a block diagram of a sample thickness measuring apparatus performing a sample thickness measuring process of a first embodiment.

Description will first be made on the outline of convergent beam electron diffraction (CBED). Convergent beam electron diffraction is one kind of a measuring approach using a transmission electron microscope. An electron beam converged to a diameter of, e.g., several nm is applied to a sample to obtain a diffraction image (interference pattern).

FIG. 1A is a schematic perspective view schematically illustrating a state that a sample is observed by convergent beam electron diffraction. An electron beam 2 converged into a conical shape is applied to a sample 1. Electron beams expanding in a conical shape are output from the sample 1, corresponding to a transmission wave or diffraction waves. Formed as observation images are a central disc 3a by a transmission wave, and scattered discs 3b, 3c and the like by diffraction waves distributed around the central disc 3a. The central disc 3a and scattered discs 3b and the like are images of a disc shape having a Bragg scattering position PB as their centers, and take complicated interference patterns due to electron scattering in the sample 1. In the following description, a central disc or a scattered disc is simply called a disc in some cases.

The electron beam 2 is generally applied to the sample 1 in such a manner that an electron beam at the center (on a center axis of a conical shape) of the incidence electron beam 2 is vertically applied to the sample surface. However, in some cases, the electron beam 2 is displaced from vertical incidence and applied being inclined. As the incidence electron beam 2 is inclined, the center PB of each disc is displaced from that of vertical incidence.

FIG. 1B illustrates an example of an observed convergent beam electron diffraction image. The sample is an Si thin film, and an observation direction is [011] direction. Scattered discs are distributed around a central disc.

A diffraction pattern is formed in each disc. An alignment angle of an interference pattern in an observation viewing field corresponds to an alignment angle of the sample, and as the sample is rotated in an in-plane, the interference pattern rotates also.

An interference pattern in each disc reflects the physical properties of a sample such as a crystal structure and a thickness. The physical properties indicate any of physical properties which changes interference pattern of a convergent beam electron diffraction image.

If the crystal structure of a sample is already known, it is possible to make a computer calculate an interference pattern of each disc of convergent beam electron diffraction. An interference pattern obtained by a computer is called a calculated convergent beam electron diffraction image (or simply a calculation image). On the other hand, an interference pattern observed with a transmission electron microscope is called an experimental convergent beam electron diffraction image (or simply an experiment image).

For example, a first embodiment to be described below assumes a case in which although the crystal structure of a sample is already known (so that a convergent beam electron diffraction image is able to be obtained), a thickness of the sample is not known. This case for example, corresponds to a case in which although the crystal structure and impurity concentration of a sample are already known, the number of impurities is not known so that a thickness of the sample is desired to be measured in order to know a volume of the sample.

It is possible to estimate a thickness of a sample by searching a calculation image most coincident with the experiment image, from calculation images calculated in advance for a variety of sample thicknesses. The techniques of direct comparison between experiment and calculation images, are, however, associated with some difficulties such as a very large amount of data to be processed. As the techniques of reducing an amount of data to be processed, the present inventors propose the techniques of comparing calculation images and experiment images of convergent beam electron diffraction via Zernike moments, as will be described in the following.

Next, the Zernike moment will be described. The Zernike moment is a complex moment which configures a complete orthogonal system in a unit circle and has the characteristics that an intensity remains unchanged relative to rotation. A Zernike moment $A_{n,m}$ of a two-dimensional image having an intensity f(x, y) in an (x, y) coordinate system is represented by the following formula (1):

$$A_{n,m} = \frac{n+1}{\pi} \int dx \int dy f(x,y) V_{n,m}^*(x,y) \tag{1}$$

where $V_{n,m}$ (x, y) is represented by the following formula (2):

$$V_{n,m}(x,y) = \sum_{s=0}^{(n-|m|)/2} \frac{(-1)^s (n-s)! \rho^{n-2s}}{s![(n+|m|)/2-s]![(n-|m|)/2-s]!} \exp(im\theta) \tag{2}$$

where n and m are both integers, $|m|<=n$, and $n-|m|$ is even. It is assumed that $\rho=\sqrt{(x^2+y^2)}$ and $\theta=\tan^{-1}(y/x)$ Since a Zernike moment $A_{n,m}$ is obtained by integration of all pixels, this moment does not depend strongly on a resolution of an image. Further, since an angle dependency item is contained only in exp (im$\theta$) of $V_{n,m}$, an intensity $|A_{n,m}|$ of a Zernike moment does not depend upon a rotation angle of an image. The order of a Zernike moment $A_{n,m}$ is defined by n. The number of Zernike moments is the order n or larger.

FIG. 2 illustrates examples of 0-th to 5-th order Zernike moments. The numbers of Zernike moments are one for the 0-th order, one for the first order, two for the second order, two for the third order, three for the fourth order, and three for the fifth order: twelve in total for the 0-th order to the fifth order. For example, if Zernike moments from the 0-th to 5-th orders are used, the characteristics of an image are able to be represented by a vector constituted of twelve complex numbers of $A_{0,0}$ to $A_{5,5}$.

FIGS. 3A to 3C illustrate calculation images of an Si central disc along an observation direction of [011]. FIGS. 3B and 3C illustrate calculation images of the calculation image of FIG. 3A rotated by 40° and 80°, respectively.

FIG. 3D is a graph plotting 0-th to 4-th order intensities $|A_{n,m}|$ by rotating the calculation image of FIG. 3A by an angle from 0° to 90°, and calculating Zernike moments of the calculation image at a pitch of 10°. It is confirmed that the Zernike moment intensities $|A_{n,m}|$ do not depend upon a rotation angle of an image as described above. In the graph illustrated in FIG. 3D, the Zernike moment intensities $|A_{n,m}|$ finely fluctuate relative to an angle change. This may be the calculation error ascribed to use of the (x, y) coordinate system.

Consideration will be made on an embodiment of using Zernike moments suitable for comparison between a calculation image and an experiment image of convergent beam electron diffraction.

Description will be made first on that it is suitable for using the Zernike moment intensities for the comparison. As described above, a Zernike moment intensity remains unchanged relative to rotation of an image. Namely, if two convergent beam electron diffraction images, for example, the images at rotation angles 0° and 40° illustrated in FIGS. 3A and 3B, are coincident excepting the rotation influence (if interference patterns are coincident), then the Zernike moment intensities are coincident as illustrated in FIG. 3D. It is therefore possible to compare a calculation image and an experiment image by comparing the Zerkite moment intensities without considering a rotation influence. Namely, even if the experiment image rotates relative to the calculation image, direct comparison becomes possible.

If the calculation image and experiment image are to be compared by considering a rotation angle, a phase of the Zernike moment is used. Since a Zernike moment is a complex number, this moment has an intensity and a phase. As will be later described, after comparison using the Zernike moment intensities, comparison using the phases is performed to realize efficient comparison.

Next, consideration will be made on a preferable order range of
Zernike moments to be used for comparison. As will be understood from the formula (1), the intensity of 0-th order Zernike moment at n=m=0 is represented by integration of the image intensity f(x, y) in the in-plane, and may be considered as an average image intensity. When the experiment image and calculation image are compared, it is very difficult to strictly compare the background intensities, it is desired to compare relative intensities. It is therefore desired to omit information on an image average intensity from the comparison object, i.e., not to consider the 0-th order Zernike moment as the information representative of the image characteristics.

The n-th order Zernike moments have the characteristics that the moments reflect the characteristics of n-fold (2n/n) symmetry of the image. The characteristics at least 4-fold symmetry or higher are desired to be captured as the information representative of the characteristics of interference patterns. It is therefore desired to consider the Zernike moments of at least the 4-th or higher order.

As will be understood from the examples of the Zernike moments from the 0-th to 5-th orders illustrated in FIG. 2, as the number of the order n increases, the number of Zernike moments increases abruptly. Therefore, if the Zernike moments up to the higher order are used for the comparison, the data amount becomes too large. It is therefore desired to use Zernike moments, e.g., at the 20-th order or lower.

In summary, it is desired to consider Zernike moments at least 4-th or higher order Zernike moments excepting the 0-th order (i.e., first to fourth or higher order Zernike moments). If it is desired that the data amount is not too large, it may be said that the maximum order is set to 20-th or lower.

According to the experiments made by the present inventors, it has been found that the Zernike moments up to, e.g., the 10-th order are preferable in that the information amount is sufficient and the data amount does not become too large. The number of Zernike moments up to the 10-th order is 36, i.e., 35 excepting the 0-th order Zernike moment. In this case, the characteristics of each image are able to be represented by a 35-th order vector.

Next, description will be made on a sample thickness measuring method of the first embodiment.

FIG. 4 is a schematic block diagram of a sample thickness measuring apparatus for performing the sample thickness measuring process of the first embodiment.

FIG. 5 is a flow chart illustrating the sample thickness measuring process of the first embodiment. Description will be made referring mainly to the block diagram of FIG. 4 and also referring to the flow chart of FIG. 5.

A microscope main body 11 includes a transmission electron microscope. An image input unit 21, a Zernike moment calculation unit 22, a Zernike moment intensity comparison unit 23, a Zernike moment phase comparison unit 24, an output unit 25, a convergent beam electron diffraction image calculation unit 31 and a database 32 may be formed by, e.g., a personal computer.

Sample thickness measurement starts (Step S0 in FIG. 5). The microscope main body 11 acquires an experimental convergent beam electron diffraction image of a measurement sample (Step S1 in FIG. 5). The sample may be an Si thin film having a thickness of roughly 200 nm. Data of the convergent beam electron diffraction experiment image is input to the image input unit 21.

The image input unit 21 performs image processing of cutting a central disc portion from the whole experiment image. For example, a circle area not superposing a peripheral scattered disc is cut. In this embodiment, an experiment image of the cut central disc is simply called an experiment image.

Data of the experiment image is sent to the Zernike moment calculation unit 22. The Zernike moment calculation unit 22 calculates the intensities and phases of the Zernike moments of the experiment image to, e.g., the tenth order (Step S2 in FIG. 5). In the following description, it is assumed that the Zernike moments up to the tenth order are obtained.

The convergent beam electron diffraction image calculation unit 31 calculates calculated convergent beam electron diffraction images of the central disc by changing the thickness t. In this embodiment, a central disc calculation image is simply called a calculation image in the following description. For example, calculation images are calculated in a thickness range of 150 nm to 350 nm at a pitch of 1 nm. Calculation images are calculated at each thickness t by changing the disc center coordinates $(x_0, y_0)$. Changing the disc center coordinates $(x_0, y_0)$ corresponds to slightly changing an incidence direction of an electron beam to a sample.

The calculation image is calculated for each sample thickness and for each electron beam incidence direction. The convergent beam electron diffraction image calculation unit 31 calculates Zernike moment intensities of each calculation image up to the tenth order.

The Zernike moment intensities of each calculation image are stored in the database 32 along with the calculation conditions (thickness t and disc center coordinates $(x_0, y_0)$). The phases of the Zernike moments of each calculation image are not required to be stored in the database 32.

A process of making the convergent beam electron diffraction image calculation unit 31 calculate calculation images and prepare the database 32 storing the Zernike moment intensities may be executed prior to the sample observation by the microscope main body 11.

The Zernike moment intensity comparison unit 23 compares the Zernike moment intensities of the experiment image with the Zernike moment intensities of any one of the calculation images at each sample thickness and each incidence direction of an incident electron beam.

The intensities of the Zernike moments from the 0-th to 10-th orders of each of the experiment image and calculation image constitute a 35-th order vector (this is called an intensity vector), and the intensity vector of the experiment image is compared with the intensity vector of the calculation image.

A factor representative of a similarity of vectors may be, e.g., a cosine similarity. The cosine similarity is defined as an inner product of two vectors normalized to unit vectors. If both the vectors are coincident, the vectors are parallel, and the inner product is 1. If a difference between the vectors is maximum, the vectors are perpendicular, and the inner product is 0. Namely, the cosine similarity of two vectors 0 or larger and 1 or smaller. If the cosine similarity is as nearer to 1 (larger), it is judged that both the vectors are similar.

The Zernike moment intensity comparison unit 23 calculates the cosine similarity between the intensity vector of the experiment image normalized to the unit vector and the intensity vector of the calculation image normalized to the unit vector, for all calculation images by changing the parameters of the thickness t and disc center coordinates ($x_0$, $y_0$) (Step S3 in FIG. 5).

The calculation conditions (thickness t and disc center coordinates ($x_0$, $y_0$)) of the calculation image having the largest cosine similarity are output (Step S4 in FIG. 5). The calculation image having the largest cosine similarity is called an optimum calculation image A sample thickness corresponding to the optimum calculation image is estimated as a thickness of an observed sample, and an incidence direction of an electron beam to the observed sample is estimated from the center coordinates corresponding to the optimum calculation image. In this manner, it becomes possible to measure a sample thickness and know an incidence direction of an electron beam.

A first specific example of a sample thickness measurement will be described. The sample is an Si thin film, and the observation direction is [011] direction.

Figure 6A:
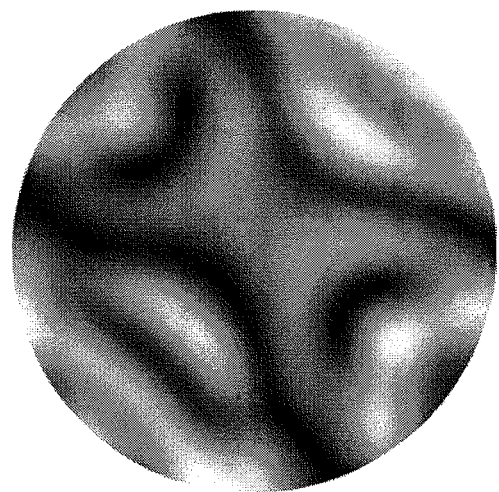
FIG. 6A illustrates an example of an experiment image.

FIG. 6A illustrates a central disc portion cut from a whole experiment image. For the output convenience, a square area of 594 pixels×594 pixels with a white space around the central disc is used as a target calculation area for the Zernike moment. If an area for calculation is limited to the inner area of the disc, the white space around the disc is not necessary.

Figure 6B:
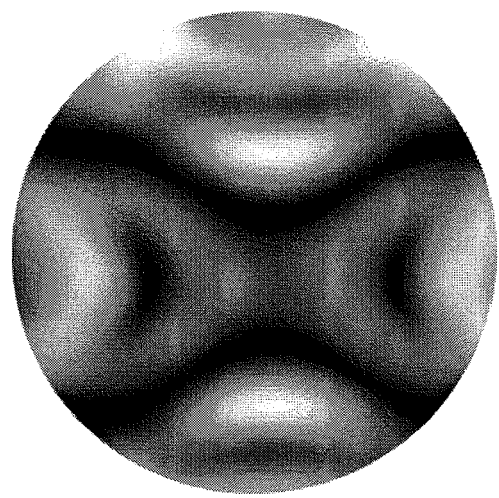
FIG. 6B illustrates an optimum calculation image for the experiment image of FIG. 6A.

FIG. 6B illustrates an optimum calculation image having the largest cosine similarity for the experiment image in FIG. 6A among the central disc calculation images. All calculation images were calculated in a sample thickness range of 150 nm to 350 nm at a sample thickness pitch of 1 nm by changing the center coordinates at 32×32 (=1024) points. The total number of calculation images is 200 thousands or more. The calculation images of 200 thousands or more are compared with the experiment image to find the optimum calculation image most coincident with the experiment image. It is seen that the optimum calculation image reproduces correctly the interference pattern of the experiment image. Although the experiment image of FIG. 6A and the optimum calculation image of FIG. 6B have different rotation angles, it is understood that good comparison is realized. It was able to obtain a sample thickness of 244 nm from the calculation conditions of the optimum calculation image.

Description will continue by referring to FIGS. 4 and 5. A parameter representative of a rotation angle of the optimum calculation image so as to be coincident with the experiment image is obtained, by considering a rotation influence neglected heretofore, in order to facilitate comparison display of the experiment image and optimum calculation image. To this end, the phase of the Zernike moment is used.

More specifically, $V_{n,m}$ (x, y) is represented by the following formula (3) by considering a parameter $\theta t$ representative of rotation:

$$V_{n,m}(x, y) = \sum_{s=0}^{(n-|m|)/2} \frac{(-1)^s (n-s)! \rho^{n-2s}}{s![(n+|m|)/2 - s]![(n-|m|)/2 - s]!} \exp[im(\theta - \theta_t)] \quad (3)$$

By using $V_{n,m}$ (x, y) of the formula (3), the phase of a Zernike moment $A_{n,m}$ is calculated from the formula (1). Similar to the intensity, the phases of the Zernike moments of the first to tenth order of each image constitute a 35-th order vector (called a phase vector).

As described above, the optimum calculation image having the interference pattern most coincident with that of the experiment image is identified without considering the rotation influence. Next, the convergent beam electron diffraction image calculation unit 31 calculates again the optimum calculation image (Step S5 in FIG. 5) at the sample thickness t and center coordinates ($x_0$, $y_0$) of the calculation conditions for the optimum calculation image. Since not the image data itself of the calculation image but the Zernike moment intensities up to the tenth order are stored in the database 32, the optimum calculation image is calculated again as image data.

The convergent beam electron diffraction image calculation unit 31 calculates phases of the Zernike moments of the optimum calculation image by changing the rotation parameter $\theta t$ (Step S6 in FIG. 5). As seen from the formula (3), changing the rotation parameter $\theta t$ corresponds to rotation of the image.

The rotation parameter $\theta t$ is changed in a 360° rotation range of, e.g., at a 1° pitch.

The phases of the Zernike moments of the experiment image have already been calculated together with the intensities (Step S2 in FIG. 5). The Zernike moment phase comparison unit 24 calculates the cosine similarity between the phase vector of the experiment image and the phase vector of the optimum calculation image, for all rotation angles $\theta t$ (Step S7 in FIG. 5).

The rotation angle $\theta t$ maximizing the cosine similarity (called an optimum rotation angle) is output (Step S8 in FIG. 5). It is possible to obtain the calculation image most coincident with the experiment image including the rotation angle by rotating the optimum calculation image by the optimum rotation angle $\theta t$. It is also possible to say that the optimum rotation angle $\theta t$ indicates a mount angle of the measured sample on a holding mechanism.

A specific example the optimum calculation image with a corrected rotation angle will be described. FIG. 7A illustrates an experiment image similar to FIG. 6A. FIG. 7B illustrates an image obtained by rotating the optimum calculation image in FIG. 6B by the optimum rotation angle. By aligning also the rotation angle, it becomes easy to grasp at once that the optimum calculation image is well coincident with the experiment image.

Description will continue by referring again to FIGS. 4 and 5. The output unit 25 outputs the optimum calculation image with the corrected optimum rotation angle, a sample thickness, and other necessary information (Step S9 in FIG. 5). Sample thickness measurement ends (Step S10 in FIG. 10).

As described above, it is possible to measure a sample thickness by comparing the experiment image and calculation images of convergent beam electron diffraction via Zernike moment intensities. Database may store the Zernike moment intensities, not the image data itself.

For example, if the Zernike moments from the first to tenth orders are used, the characteristics of an image are able to be represented by a 35-th order intensity vector. It is not necessary to form a database of phases of the Zernike moments. The capacity of the database is therefore reduced, and it is possible to shorten a search process for searching the optimum calculation image.

Consider a comparative example of measuring a sample thickness through direct comparison between the experiment image and calculation image by using image data itself. In this comparative example, the amount of data to be processed becomes huge, and it is necessary to perform image matching by rotating the image for comparison. With the image rotation, an error is likely to be caused by interpolation and a different rotation angle. In the embodiment, since Zernike moment intensities are used, an image rotation operation is not necessary so that a measurement precision can be improved.

It is possible to measure a sample thickness by using only the Zernike moment intensities. If the Zernike moment phases are also used, it is possible to perform comparison display of the experiment image and optimum calculation image with the aligned rotation angles. It is possible to perform calculation regarding the comparison with the experiment image phase only for the optimum calculation image, after the optimum calculation image is obtained through intensity comparison.

A second specific example of a sample thickness measurement will be described. In the second specific example, experiments for an Si thin film sample different from the first specific example are performed, and analysis is performed at a lower resolution than the first specific example.

FIG. 8A illustrates an experiment image. A size of a cut experiment image was 88 pixels×88 pixels.

FIG. 8B illustrates an optimum calculation image. Even in the experiment results at a different resolution, the Zernike moments are able to be obtained in a similar manner, it is therefore possible to perform comparison between an experiment image and a calculation image by using the database used for the analysis of the first specific example also for the second specific example. A sample thickness was 282 nm under the optimum calculation image.

In the first embodiment described above, a sample thickness was measured as an example of physical properties measurement using convergent beam electron diffraction. Physical properties are not limited to a thickness. It is possible to estimate physical properties by comparing an experiment image with a calculated convergent beam electron diffraction image calculated by changing physical properties. In this case, it is possible to compare an experiment image with calculation images via Zernike moment intensities, similar to the sample thickness measurement of the first embodiment.

In addition to a thickness, the physical properties include, e.g., a crystal bending distortion, crystal composition and the like. The physical properties to be changed for obtaining a calculation image include a parameter and the like for modeling the physical properties. In the second embodiment to be described below, a crystal bending distortion is modeled by using two bending distortion coefficients a and b. By changing the bending coefficients a and b, calculation images of various bending distortions are obtained.

Next, description will be made on a crystal bending distortion measuring method of the second embodiment. First, a sample to be measured and a bending distortion model will be described.

Figure 9:
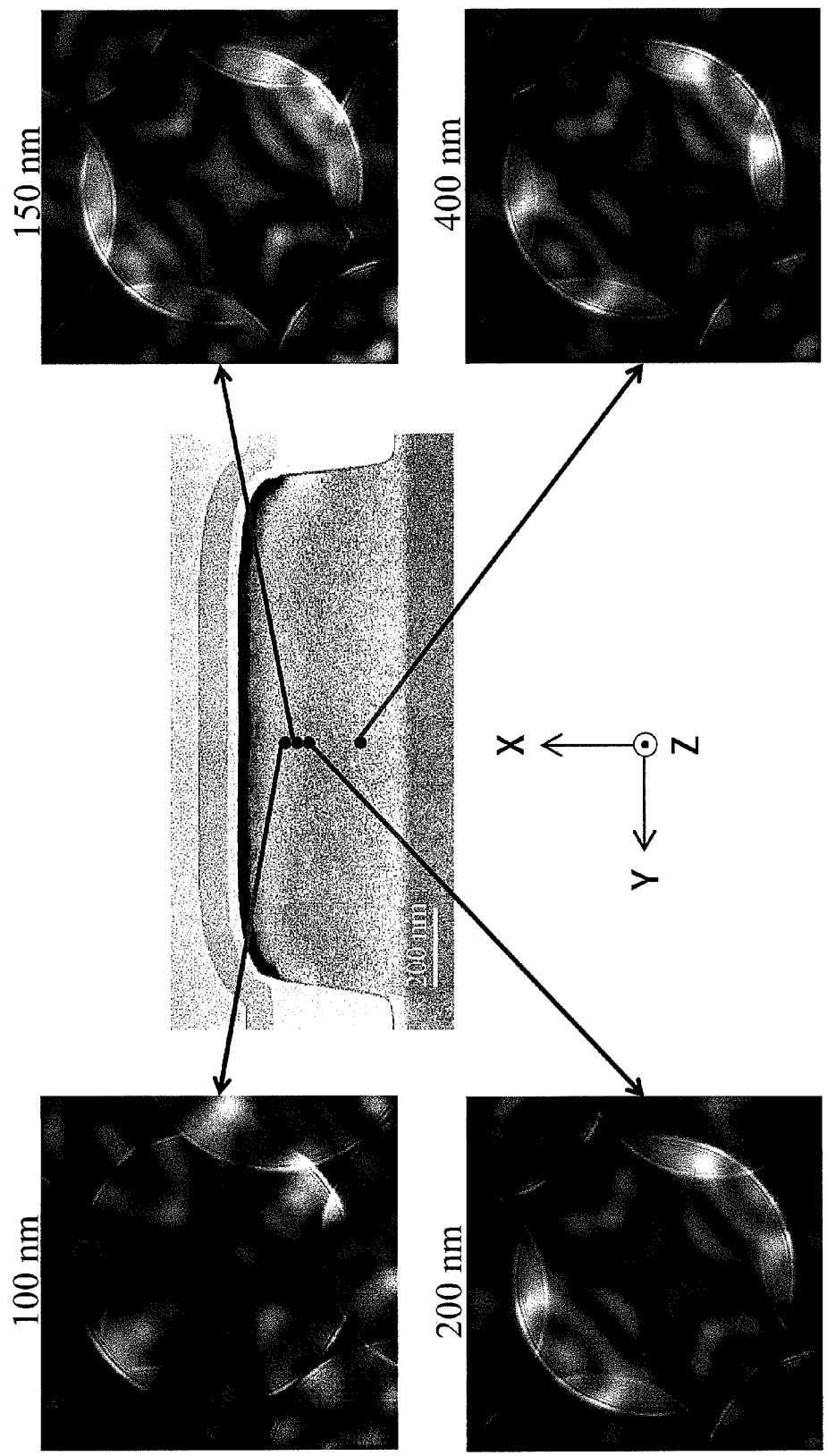
FIG. 9 illustrate an electron microscope photograph of a sample whose bending distortion is measured in a second embodiment, and experimental convergent beam electron diffraction images at each measurement point of the sample.

FIG. 9 illustrates an electron microscope photograph of a sample whose bending distortion is measured by the second embodiment method, and convergent beam electron diffraction experiment images at each measurement position in the sample. This sample has a lamination structure that a cobalt silicide film is formed on an Si film. An up-down direction on the drawing sheet is a film forming thickness direction. The Si film is formed in a lower region, and a black region on the Si film is a cobalt silicide film. Another member is further formed on the cobalt silicide film.

This lamination structure is sliced to form a thin piece of, e.g., about 245 nm thick to use the thin piece as a sample to be measured for convergent beam electron diffraction. An XYZ orthogonal coordinate system is defined, where a film forming thickness direction is an X-axis, and a thickness direction of a sample to be measured for convergent beam electron diffraction is a Z-axis. An electron beam is made incident along the Z-axis direction.

In the sample used, the Si film is distorted in a manner that the nearer to the interface to the cobalt silicide film, the Si film is distorted elongating a lattice pitch. A convergent beam electron diffraction image changes with the amount of distortion. FIG. 9 illustrates convergent beam electron diffraction images measured at depths of 100 nm, 150 nm, 200 nm and 400 nm in a film forming thickness direction from the interface between the Si film and cobalt silicide film.

FIG. 10A is a schematic diagram illustrating bending distortion of the Si film and an incidence electron beam. The lattice pitch is elongated and the bending distortion becomes larger on the cobalt silicide film side in the upper region in the film forming thickness direction (X-direction), and the bending distortion becomes smaller in the lower region in the film forming thickness direction.

FIG. 10B is a schematic diagram illustrating a model of bending distortion near a measurement position of convergent beam electron diffraction.

The details of this model are described in "T. Yamazaki, A. Kashiwagi, K. Kuramochi, M. Ohtsuka, I. Hashimoto, and K. Watanabe, Journal of Electron Microscopy 57 (2008) pp. 181 to 187".

In this model, distortion of a measurement sample in the thickness direction (Z-direction) is not considered, and the measurement sample is dealt as a flat plate parallel to the XY plane. Consideration is made not on bending distortion along a thickness direction (Z-direction) of the measurement sample but on bending distortions formed by displacement of a unit lattice in the X- and Y-directions in a middle region in the measurement sample thickness direction. FIG. 10B illustrates bending distortion formed by displacement in the X-direction (film forming thickness direction). Bending distortion formed by displacement in the X-direction is called X-direction bending distortion, whereas bending distortion formed by displacement in the Y-direction is called Y-direction bending distortion.

It is possible to calculate convergent beam electron diffraction image by using approximate bending distortion assuming that a unit lattice is disposed on a parabola having as an origin the center of the measurement sample in the thickness direction (Z-direction). The larger the second order coefficient of the palabola, the distortion is larger, and the smaller (nearer to 0), the distortion is smaller. The second order coefficient of the parabola representative of the X-direction bending distortion is called an X-direction bending distortion coefficient a, and the second order coefficient of the parabola representative of the Y-direction bending distortion is called a Y-direction bending distortion coefficient b. In this model, the bending distortion is represented by using the two bending distortion coefficients a and b as parameters.

An angle (called a bending distortion angle θ) between a direction that a parabola representative of a bending distortion departs from the surface of the measurement sample and a measurement sample thickness direction (Z-direction) is one-to-one correspondence with a distortion coefficient (second order coefficient of a parabola) if the measurement sample thickness is known. The larger the bending angle θ, the bending distortion is larger.

The measurement position illustrated in FIG. 9 is set to a position providing a symmetrical sample structure in the Y-direction. It is expected at this measurement position that the Y-direction bending distortion is hardly formed because of symmetry (i.e., the Y-direction bending distortion b is almost 0).

Next, description will be made on the bending distortion measuring method of the second embodiment, by referring again to FIG. 4 (a block diagram of the measuring apparatus) and FIG. 5 (a flow chart of a measuring sequence).

In the second embodiment, the convergent beam electron diffraction image calculation unit 31 calculates a calculation image by changing the bending distortion coefficients a and b as well as the thickness t and disc center coordinates $(x_0, y_0)$ described in the first embodiment, as parameters. The Zernike moment intensities of the calculation image obtained by changing also the bending coefficients a and b are stored in the database 32.

Bending distortion measurement starts at Step S0. Both the bending distortion and sample thickness are measured. Step S1 of acquiring a convergent beam electron diffraction experiment image, Step S2 of calculating the intensities and phases of the Zernike moments of an experiment image, Step S3 of calculating the cosine similarity of the intensity vectors of the experiment image and calculation image for all calculation images by changing the parameters (sample thickness t, center coordinates $(x_0, y_0)$ and bending distortion coefficients a and b) corresponding to the physical properties, and Step S4 of determining the optimum calculation image are executed in the manner similar to the first embodiment.

In the second embodiment, as the optimum calculation image is obtained, it becomes possible to estimate the sample thickness, electron beam incidence direction, and bending distortion coefficients a and b. Step S5 and following Steps are executed thereafter so that to make the experiment image and calculation image be coincident, including the rotation direction, similar to the first embodiment.

Figure 11:
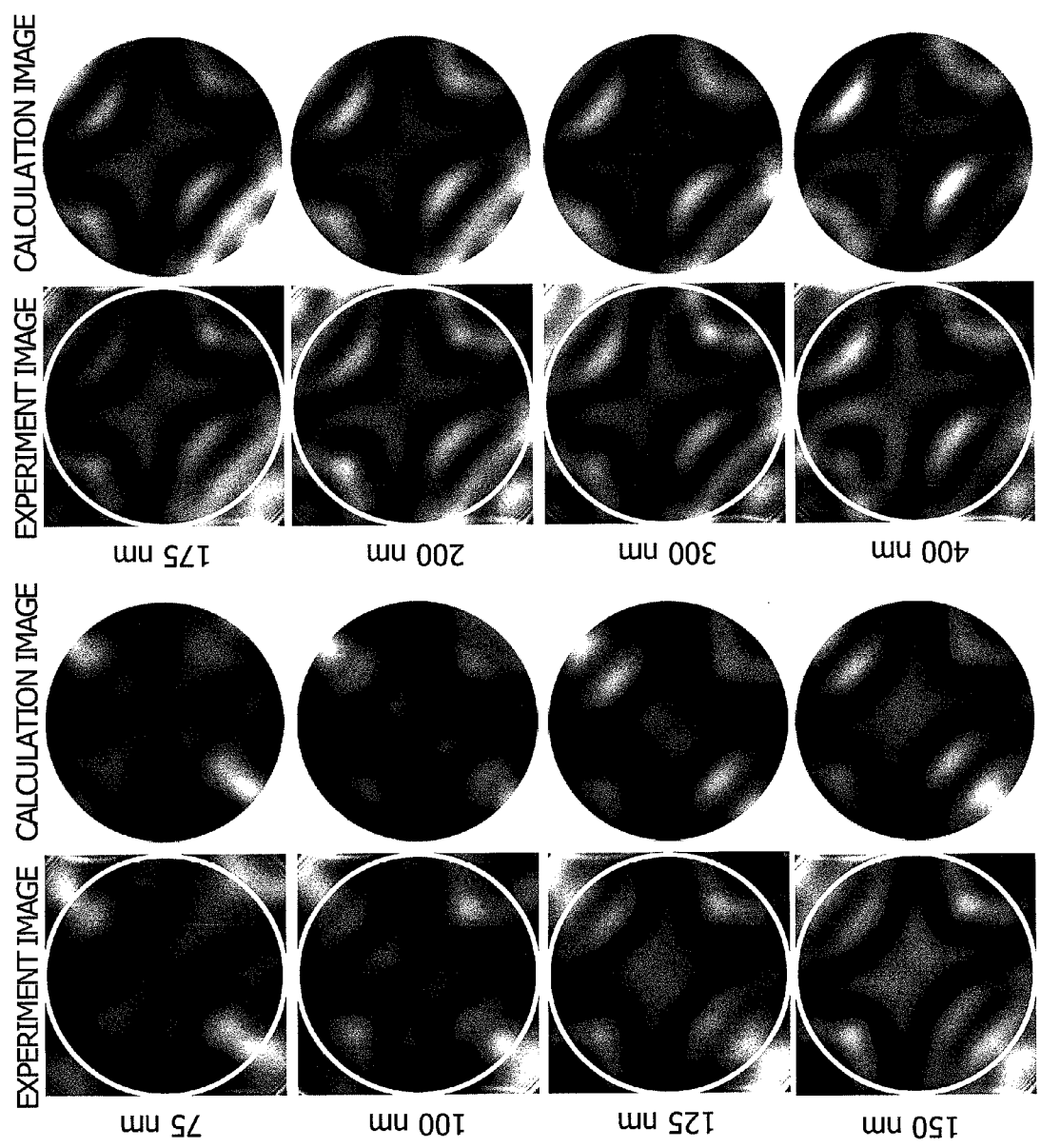
FIG. 11 is experiment images measured at various depths from an interface between an Si film and a cobalt silicide film and optimum calculation images corresponding to the experiment images.

FIG. 11 illustrates convergent beam electron diffraction experiment images and corresponding optimum images, measured at depth positions of 75 nm, 100 nm, 125 nm, 150 nm, 175 nm, 200 nm, 300 nm and 400 nm in the film forming thickness direction from an interface to the cobalt silicide film. It is seen that the optimum calculation images reproduce correctly the interference patterns of the experiment images.

The sample thicknesses obtained from the optimum calculation images at each measurement position were almost equal to about 245 nm. The Y-direction bending distortion coefficient b at each measurement position was almost 0, i.e., distortion in the Y-direction exists hardly. The result anticipated from symmetry of measurement positions was confirmed.

Figure 12:
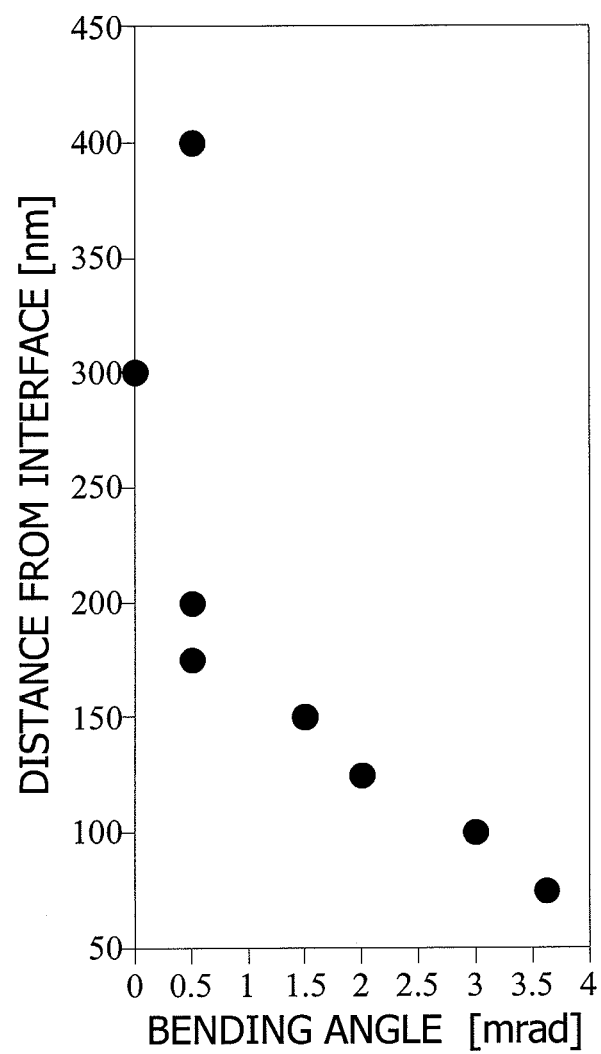
FIG. 12 is a graph illustrating a relation between a depth from a cobalt silicide interface and a bending distortion.

FIG. 12 is a graph illustrating a relation between a depth from the cobalt silicide interface and an amount of bending distortion coefficient. The horizontal axis of the graph indicates a bending angle θ corresponding to the X-direction bending distortion coefficient a in the unit of mrad, and the ordinate indicates a depth from the cobalt silicide interface in the unit of nm. It is seen that the bending distortion hardly exists at the position deeper than 150 nm, becomes distinctive, and larger at a shallower position.

As described above in the second embodiment, it is also possible to measure the bending distortion by comparing the experiment image and calculation images of the convergent beam electron diffraction via Zernike moment intensities.

In other embodiments, for example, composition may be measured. For example, cobalt concentration may be estimated by comparing the experiment image of a cobalt silicide sample with calculation images obtained by changing cobalt concentration in cobalt silicide.

Next, the third embodiment will be described. In the third embodiment, a polarity of a crystal grown sample is judged by comparing the experiment image and calculation image.

A measurement sample is a sample having a growth polarity, e.g., a GaN film. The GaN film grows at a Ga polarity or N polarity. The measurement sample was sliced having a cross section in the film forming thickness direction as an electron incidence plane. One direction in the incident electron beam in-plane of the measurement sample is a GaN crystal growth direction.

FIG. 13A illustrates an experiment image of the GaN sample. A crystal growth direction is indicated by an arrow. A disc represented by a white circle is a central disc. Scattered discs are distributed around the central disc. In this example, the central disc and scattered disc are not superposed upon each other.

On both sides of the central disc, a scattered disc having a bright central region is observed on the downside of the growth direction, and a scattered disc having a dark central region is observed on the upside of the growth direction. The alignment order of the scattered disc having the bright central region and the scattered disc having the dark central region is reversed as the polarity is reversed (forming an image rotated by 180 degrees in the in-plane).

As described in the first embodiment and the like, a sample thickness and the like are able to be measured by comparing the calculation image with an interference pattern (indicated in the lower area as the enlarged pattern) of the central disc.

FIG. 13B illustrates the optimum calculation image of the experiment image in FIG. 13A, including the scattered disc. The enlarged interference pattern of the scattered disc is illustrated in the lower area. A growth direction of the sample held during observation of the convergent beam electron diffraction image is known already, although the polarity is not known. The calculation image is calculated by assuming that one of growth polarities is, e.g., the Ga polarity. The Ga polarity is indicated by an arrow. On both sides of the central disc, a scattered disc having a bright central region is observed on the downside of the Ga polarity (on the upside of the N-polarity direction), and a scattered disc having a dark central region is observed on the upside of the Ga polarity (on the downside of the N-polarity direction).

Description will be made on a polarity judging method by referring to FIG. 14 and the flow chart of FIG. 5. In the manner similar to the first and second embodiments, up to Step S4, the optimum calculation image is determined and a sample thickness and the like area obtained. Thereafter, up to Step S8, the optimum rotation angle is determined to align the rotation angles of the optimum calculation image and experiment image. As described above, it is possible to measure a sample thickness and the like by using the calculation image of only a central disc (of a single disc) and to align the rotation angle of the experiment image and the rotation angle of the experiment image.

The polarity direction assumed for the calculation image is aligned almost with the growth direction of the sample under observation, and the optimum rotation angle does not become so large.

As illustrated in FIG. 14, in the third embodiment, Step S9 is replaced with Step S9'. At Step S9' the optimum calculation image including the scattered discs distributed around the central disc is calculated again. The calculation image including a plurality of discs is called a whole calculation image, as illustrated in FIG. 13B.

As the rotation directions are also aligned, the crystal growth direction of the experiment image is aligned parallel to the polarity direction assumed for the calculation image. If the alignment order of the scattered disc having the bright central region and the scattered disc having the dark central region is coincident for both the experiment image and the whole calculation image, it is possible to judge that the growth polarity of the measurement sample is coincident with the assumed polarity, whereas this alignment order is reversed in the experiment image and the whole calculation image, it is possible to judged that the growth polarity of the measurement sample is reversed from the assumed polarity.

At Step S9', in addition to the measurement results such as a sample thickness, the whole calculation image and the judged polarity can be output.

Even if the polarities of the experiment image and the whole calculation image are coincident or reversed, the interference patterns of the central discs are coincident. The polarity is therefore unable to be judged from observation of only the central discs.

As described above in the third embodiment, it is possible to judge a crystal growth direction by comparing the experiment image and the whole calculation image of convergent beam electron diffraction.

Crystal having three or more atoms is considered that the atom arrangement may influence the interference pattern of the central disc. Similar to the first and second embodiment, it is therefore possible to obtain knowing of a crystal structure and the like from the comparison between the experiment image and calculation image of the central disc.

In the embodiments described above, a sample thickness and a bending distortion are measured by using the central disc. These physical properties are able to be measured if there is the interference pattern of one disc and may be measured by using a scattered disc. However, the central disc is suitable for measurement because the central disc has a larger intensity than the scattered discs and provides an interference pattern with smaller noises.

In the embodiments described above, although the cosine similarity is used as the factor of similarity of the Zernike moment intensity vectors or phase vectors of the experiment image and calculation image, other factors may also be used. For example, the similarity may be evaluated by a minimum square sum minimizing the square of differences.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A physical properties measuring method comprising:
    irradiating a convergent electron beam to a sample, and acquiring an experimental diffraction pattern of said sample based on Bragg scattering;
    calculating Zernike moment intensities of said experimental diffraction pattern; and
    comparing said Zernike moment intensities of said experimental diffraction pattern with Zernike moment intensities of each of ideal diffraction patterns which are calculated on changed physical properties of said sample,
    wherein said Zernike moment intensities are intensities of Zernike moments $A_{n,m}$, said Zernike moments $A_{n,m}$ having an intensity $f(x, y)$ in an $(x, y)$ coordinate system are represented by $$A_{n,m} = \frac{n+1}{\pi} \int dx \int dy f(x, y) V_{n,m}^*(x, y)$$

where $V_{n,m}(x, y)$ is represented by $$V_{n,m}(x, y) = \sum_{s=0}^{(n-|m|)/2} \frac{(-1)^s (n-s)! \rho^{n-2s}}{s![(n+|m|)/2 - s]![(n-|m|)/2 - s]!} \exp(im\theta)$$

where n and m are both integers, $|m| \leq n$, $n-|m|$ is even, $\rho = \sqrt{(x^2+y^2)}$ and $\theta = \tan^{-1}(y/x)$.

2. The physical properties measuring method according to claim 1, wherein said physical properties include at least one of a thickness, a distortion and a composition.

3. The physical properties measuring method according to claim 1, wherein said Zernike moment intensities of each of said ideal diffraction patterns are stored in a database.

4. The physical properties measuring method according to claim 1,
    wherein:
    in said calculating Zernike moment intensities of said experimental diffraction pattern, further calculating also Zernike moment phases of said experimental diffraction pattern, said Zernike moment phases being phases of said Zernike moments $A_{n,m}$; and
    in said comparing said Zernike moment intensities of said experimental diffraction pattern with Zernike moment intensities of each of ideal diffraction patterns, searching a first optimum diffraction pattern, which is most coincident with said experimental diffraction pattern, in said ideal diffraction patterns,
    further comprising:
    calculating Zernike moment phases of said first optimum diffraction pattern at each rotation angle in rotating the first optimum diffraction pattern; and
    comparing said Zernike moment phases of said experimental diffraction pattern with said Zernike moment phases of said optimum diffraction pattern at each rotation angle.

5. The physical properties measuring method according to claim 4, wherein:
    said sample includes a crystal grown film having a polarity, and
    the experimental diffraction pattern includes a plurality of disc images among a central disc by a transmission wave of said convergent electron beam to said sample and scattered discs by diffraction waves of said convergent electron beam to said sample,
    further comprising:
    acquiring a second optimum diffraction pattern by calculating said first optimum diffraction pattern including a plurality of disc images corresponding to said central disc and said scattered discs; and
    comparing said second optimum diffraction pattern with said experimental diffraction pattern to judge a polarity of said crystal grown film.

6. The physical properties measuring method according to claim 1, wherein:
the experimental diffraction pattern includes a plurality of disc images among a central disc by a transmission wave of the convergent electron beam to the sample and scattered discs by diffraction waves of the convergent electron beam to the sample;
each of the ideal diffraction pattern includes a plurality of disc images corresponding to the central disc and the scattered discs; and
in comparing Zernike moment intensities of the experimental diffraction pattern with Zernike moment intensities of each of ideal diffraction patterns, both central discs of the experimental diffraction pattern and each of the ideal diffraction patterns are compared.

7. A physical properties measuring apparatus comprising:
a means irradiating a convergent electron beam to a sample for acquiring an experimental diffraction pattern of said sample based on Bragg scattering;
a calculation unit for calculating Zernike moment intensities of said experimental diffraction pattern; and
an intensity comparison unit for comparing said Zernike moment intensities of said experimental diffraction pattern with Zernike moment intensities of each of ideal diffraction patterns which are calculated on changed physical properties of said sample,
wherein said Zernike moment intensities are intensities of Zernike moments $A_{n,m}$, said Zernike moments $A_{n,m}$ having an intensity $f(x, y)$ in an $(x, y)$ coordinate system are represented by $$A_{n,m} = \frac{n+1}{\pi} \int dx \int dy f(x, y) V^*_{n,m}(x, y)$$

where $V_{n,m}(x, y)$ is represented by $$V_{n,m}(x, y) = \sum_{s=0}^{(n-|m|)/2} \frac{(-1)^s (n-s)! \rho^{n-2s}}{s![(n+|m|)/2-s]![(n-|m|)/2-s]!} \exp(im\theta)$$

where n and m are both integers, $|m|<=n$, $n-|m|$ is even, $\rho=\sqrt{(x^2+y^2)}$ and $\theta=\tan^{-1}(y/x)$.

8. The physical properties measuring apparatus according to claim 7, further comprising a database storing said Zernike moment intensities of said ideal diffraction patterns.

\* \* \* \* \*